US012580166B2

(12) United States Patent
Gahan et al.

(10) Patent No.: US 12,580,166 B2
(45) Date of Patent: Mar. 17, 2026

(54) TWO STAGE ION CURRENT MEASUREMENT IN A DEVICE FOR ANALYSIS OF PLASMA PROCESSES

(71) Applicant: Applied Materials, Inc., Santa Clara, CA (US)

(72) Inventors: David Gahan, Terenure Dublin (IE); JJ Lennon, Ballymun (IE); Paul Scullin, Dublin (IE); James Doyle, Wexford (IE)

(73) Assignee: Applied Materials, Inc., Santa Clara, CA (US)

( * ) Notice: Subject to any disclaimer, the term of this patent is extended or adjusted under 35 U.S.C. 154(b) by 580 days.

(21) Appl. No.: 17/948,465

(22) Filed: Sep. 20, 2022

(65) Prior Publication Data

US 2023/0143487 A1    May 11, 2023

(30) Foreign Application Priority Data

Nov. 9, 2021    (EP) .................................... 21207043

(51) Int. Cl.
*H01J 37/32*        (2006.01)

(52) U.S. Cl.
CPC .................. *H01J 37/32917* (2013.01); *H01J 2237/24564* (2013.01)

(58) Field of Classification Search
None
See application file for complete search history.

(56) References Cited

U.S. PATENT DOCUMENTS 5,451,784 A      9/1995  Loewenhardt et al.
11,908,668 B2 *  2/2024  Scullin .............. H01J 37/32935
(Continued)

FOREIGN PATENT DOCUMENTS

EP        0145015 B1 *  9/1989
EP        2521158 A1 *  11/2012    ......... G01R 19/0061
(Continued)

OTHER PUBLICATIONS

English machine translation for TW-200820841-A (Year: 2008).*
(Continued)

*Primary Examiner* — Wyatt A Stoffa
*Assistant Examiner* — Alina Kaliszewski
(74) *Attorney, Agent, or Firm* — Patterson + Sheridan, LLP

(57)                ABSTRACT
Methods for obtaining ion energy distribution measurements in a plasma processing system are described. A substrate is placed in the system with an ion energy analyser embedded within it. The analyser consists of multiple conductive grids and a collection electrode, separated by insulating layers. A high-voltage generating circuit within the substrate is powered by a battery and applies voltage to the first grid. A high-voltage switch discharges the first grid to a floating ground, with a resistor in parallel. Ion current is sampled in two stages: first, while charging the first grid from floating ground to a plateau voltage, and second, while discharging through the resistor from a predetermined voltage to the plateau voltage. This setup allows for precise measurement of ion energy distribution at the substrate surface during plasma processing.

13 Claims, 7 Drawing Sheets

(56) References Cited

U.S. PATENT DOCUMENTS

| | | | | |
|---|---|---|---|---|
| 2008/0135754 | A1* | 6/2008 | Eto | H01J 37/252 |
| | | | | 250/492.22 |
| 2009/0114152 | A1* | 5/2009 | Aramaki | H01L 21/67248 |
| | | | | 118/712 |
| 2009/0242790 | A1* | 10/2009 | Chen | H01J 49/443 |
| | | | | 250/397 |
| 2011/0174777 | A1* | 7/2011 | Jensen | G01R 19/0061 |
| | | | | 216/61 |
| 2015/0144596 | A1* | 5/2015 | Brouk | H01J 37/3299 |
| | | | | 427/569 |
| 2016/0295675 | A1* | 10/2016 | Yuzurihara | H01J 37/32174 |
| 2020/0161155 | A1* | 5/2020 | Rogers | H01J 37/32146 |

FOREIGN PATENT DOCUMENTS

| | | | |
|---|---|---|---|
| EP | 3968354 A1 | 3/2022 | |
| EP | 3971942 A1 | 3/2022 | |
| TW | 200820841 A * | 5/2008 | H01J 37/32082 |

OTHER PUBLICATIONS

Gahan D. et al., "Retarding field analyzer for ion energy distribution measurements at a radio-frequency biased electrode," Rev. Sci. Instrum., 79, 033502, DOI: https://doi.org/10.1063/1.2890100 (Year: 2008).*

Sharma S. et al., "A spatially resolved retarding field energy analyzer design suitable for uniformity analysis across the surface of a semiconductor wafer," Review of Scientific Instruments, American Institute of Physics, vol. 85, No. 4, XP012184700.

Search Opinion and Report, EP Application No. 21207043.7, dated May 4, 2022, pp. 9.

Sharma S. et al., "A spatially resolved retarding field energy analyzer design suitable for uniformity analysis across the surface of a semiconductor wafer," Review of Scientific Instruments, American Institute of Physics, vol. 85, No. 4, XP012184700, published Apr. 17, 2014.

* cited by examiner

100

104

103

102

101

105

107

101

106

108

TWO STAGE ION CURRENT MEASUREMENT IN A DEVICE FOR ANALYSIS OF PLASMA PROCESSES

CROSS-REFERENCE TO RELATED APPLICATIONS

This application claims priority to European Patent Application No. EP21207043.7, filed Nov. 9, 2021, the entire contents of each are incorporated herein by reference.

FIELD

The present application relates to a device for measuring the incident charged particle current densities and energy distributions arriving at a substrate or surface during plasma processing.

BACKGROUND OF THE INVENTION

Plasma processing is used extensively in modern industry for a wide range of applications. A well-known example is the manufacture of integrated circuits in the semiconductor industry. Plasma processing is also used in the production of solar panels, flat panel displays, thin film coatings and medical devices, among many others.

The current density (ion flux) and energy distribution of the ions arriving at the substrate surface strongly influence the performance of plasma based processes. In semiconductor manufacturing the substrate is a silicon wafer while in other industries the substrate may be glass panel or a variety of alternatives. Wafer and substrate may be used interchangeably through the document but understood to mean any type of substrate to be used in a plasma process. Throughout the process the substrate surface is bombarded by plasma species, including energetic ions, to remove (etch) and/or deposit layers of material to form structures or features on the workpiece surface. Ion impact may drive the etching and deposition directly, or may be used to activate the surface for more reactive plasma species to do the work. For example, in the plasma etching of features in the semiconductor industry the ion flux and associated Ion Energy Distribution (IED) determines important parameters such as etch rate, etch selectivity and etch anisotropy. The IED is therefore a critical plasma parameter to measure, understand and control to ensure optimum process performance.

European Application No 21193805.5 describes an apparatus for obtaining ion energy distribution measurements in a plasma processing system comprising a substrate for placement in the plasma processing system, an ion energy analyser disposed in the substrate for measuring the ion energy distribution at the substrate surface during plasma processing, the analyser comprising a first conductive grid, a second conductive grid, a third conductive grid, a fourth conductive grid, and a collection electrode, each grid separated by an insulating layer, a battery power supply and a battery manager integrated in the substrate, for supplying and controlling voltage to each of the grids and the collector of the ion energy analyser; and a high voltage generating circuit within the substrate, the high voltage generating circuit comprising a high voltage pulse generator feeding a voltage multiplier, wherein the high voltage generating circuit is configured to take the output voltage of the battery manager and supply a voltage sweep the third conducive grid.

The high voltage generating circuit of European Application No 21193805.5 may be configured to generate a descending voltage sweep and the ion energy analyser configured to sample ion current while the voltage sweep is descending.

EP 3 971 942 relates to apparatus for obtaining ion energy distribution, IED, measurements in a plasma processing system comprising a substrate for placement in the plasma processing system and exposed to the plasma, an ion energy analyser disposed in the substrate for measuring the ion energy distribution at the substrate surface during plasma processing, the analyser comprising a first conductive grid, G0, a second conductive grid, G1, a third conductive grid, G2, a fourth conductive grid G3, and a collection electrode, C, each grid separated by an insulating layer, a battery power supply and a battery manager integrated in the substrate, for supplying and controlling voltage to each of the grids and the collector of the ion energy analyser, and a high voltage generating circuit within the substrate, wherein the high voltage generating circuit takes the output voltage of the battery manager and supplies a voltage sweep to the third conductive grid.

The use of a descending voltage sweep based on a rapid charge and slow discharge of the high voltage generating circuit is advantageous in that requires less power than a continuous mode which gradually increases the voltage from zero to maximum. However, there are also potential issues with using such a descending voltage sweep, which the subject application addresses.

SUMMARY

The present teachings provide a method of operating an apparatus to obtain ion energy distribution measurements in a plasma processing system comprising providing a substrate for placement in the plasma processing system and exposure to the plasma, the substrate having an ion energy analyser disposed therein for measuring the ion energy distribution at the substrate surface during plasma processing, the analyser comprising a plurality of conductive grids, and a collection electrode, C, each grid separated by an insulating layer, providing a high voltage generating circuit within the substrate and configured to take the output voltage of a battery to power the high voltage generating circuit and apply a voltage to a first grid of the plurality of conductive grids, providing a high voltage switch configured to discharge the first grid to a floating ground of the apparatus and a resistor in parallel with the high voltage switch, sampling ion current during a first stage while a first voltage is being charged on the first grid from the floating ground potential to a plateau voltage, and sampling ion current during a second stage while a second voltage applied to the first grid is discharging through the resistor from a predetermined voltage generated by the high voltage generating circuit to the plateau voltage.

The method may further comprise closing the switch to discharge the first grid to the floating ground prior to sampling ion current during the first stage.

The method may further comprise opening the switch to allow ion current from a plasma process to charge the first grid to the plateau voltage.

Optionally, the plateau voltage is determined by the ion current from the plasma process flowing through the resistor.

Optionally, the first voltage is an ascending voltage sweep and the second voltage is a descending voltage sweep.

The high voltage circuit may comprise a voltage multiplier and the resistor is in parallel with the voltage multiplier.

The resistance value of the resistor in parallel with the total capacitance to the floating ground of the voltage multiplier and the ion current may determine the rate at which the second voltage discharges.

The resistance value of the resistor in parallel with the total capacitance to the floating ground of the voltage multiplier and the ion current determines the rate at which the first voltage charges.

The method may further comprise combining current measurements taking during each sampling step to obtain a complete set of measurements.

The method may further comprise plotting the complete set measurements to provide an ion energy distribution.

Optionally, the plurality of grids is arranged as a stack of grids and the first grid is any one of the grids in the stack, the first grid being used for ion energy discrimination.

BRIEF DESCRIPTION OF THE DRAWINGS

The present application will now be described with reference to the accompanying drawings in which.

DETAILED DESCRIPTION OF THE DRAWINGS

Figure 1:
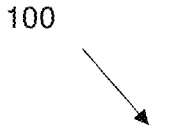
FIG. 1 shows an overview of a system in accordance that is capable of measuring the ion energy distribution arriving at ta wafer probe surface during plasma processing.

FIG. 1 illustrates an overview of a system 100 that is capable of measuring the ion energy distribution arriving at the wafer probe 101 surface during plasma processing. In this particular illustration, the diagnostic system 100 includes an imitation wafer probe with integrated ion energy analysers, electronic control circuitry, battery power supply and wireless communication. The diagnostic system further comprises a docking station 102 with integrated wireless transponder 103 to enable imitation wafer probe 101 charging, configuration and data retrieval. The docking station 102 is equipped with Ethernet connectivity to communicate with a host PC 104. Application software is provided to display and analyse retrieved data. The application software provides a control panel for scheduling the experimental assignments. An advanced programming interface (API) is also provided to allow direct interaction between the docking station and factory control software.

A four chamber plasma processing system 105 is also shown in FIG. 1. This is one of many different types of plasma processing system and is used to illustrate the functionality of the imitation wafer probe 101 in accordance with the present teachings. The plasma processing system 105 may have one or more interconnected processing chambers 106. Each processing chamber 106 is equipped with vacuum pumps to evacuate the chamber, gas flow controls to set the process recipe, vacuum gauges and transducers to regulate process operating pressure, power delivery mechanism to excite the chemical recipe to the plasma state and a pedestal to hold the substrate during processing. A load lock chamber 108 with robotic transfer mechanism 107 is used to transport substrates to and from the processing chambers. Substrate batches are delivered to the load lock chamber 108 through a cassette or a Front Opening Universal Pod (FOUP).

The preferred embodiment, the wafer probe 101 is placed in the docking station 102 and communication is established through the application software on the host PC 104. The battery power supply on the wafer probe 101 is charged, stored data retrieved and the next experimental assignment scheduled to prime the wafer probe 101. The imitation wafer probe 101 is then placed in an available slot in a Front Opening Universal Pod (FOUP) which is subsequently delivered to the load lock chamber 108. The robotic arm 107 transports the imitation wafer probe 101 to the processing chamber 106 and positions it on a processing pedestal in preparation for plasma exposure. With the chamber 106 already under vacuum, the process recipe is configured and plasma ignited. When plasma is formed, plasma species begin to bombard the wafer probe 101, a sample of which enters the sensors of the probe 101 for analysis. Analysis proceeds at the times configured in the scheduler if the on-board pressure sensor reports that the threshold for high voltage application has been met. This safety mechanism prevents the accidental application of high voltage at atmospheric pressure, which could destroy the sensor due to electrical arcing. If the pressure threshold has been met, the wafer probe 101 is activated at the scheduled time. The appropriate voltages are applied to all the grids and collector, the collector current is recorded as a function of ion discrimination potential by a microcontroller (MCU), not shown, and the resultant data is stored in memory. The wafer probe 101 returns to sleep mode until the next scheduled measurement, at which point the process is repeated. When the experimental assignment is completed, the plasma process may be terminated to allow retrieval of the wafer probe 101 from the processing pedestal using the robotic arm which transports the wafer probe back through the load lock chamber 108 to the FOUP. The user extracts the wafer probe 101 from the FOUP and places it back in the docking station 102 for data retrieval, recharging and scheduling of the next experimental assignment. Alternatively, it is possible for the wafer probe to transmit the sensor data in real-time to the docking station, from its location inside the processing chamber, using known wireless communication apparatus and methodology.

Figures 2A, 2B, 2C, 2D:
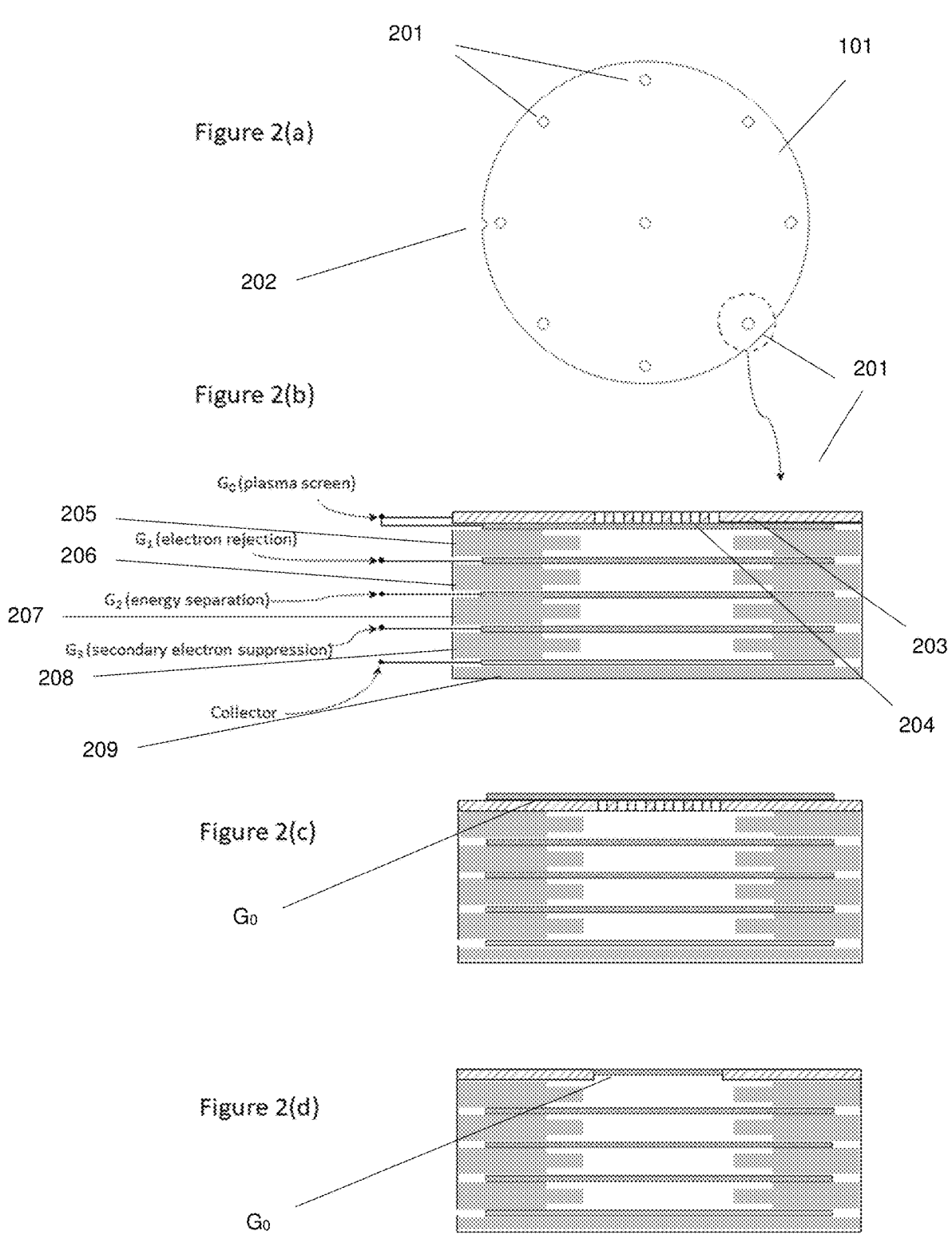
FIG. 2(a) shows an array of sensors for measuring IED distributed across the surface of a wafer probe.
FIG. 2(b) shows one arrangement of grids within a sensor of FIG. 2(a)
FIG. 2(c) shows another arrangement of grids within a sensor of FIG. 2(a)
FIG. 2(d) shows a further arrangement of grids within a sensor of FIG. 2(a)

The wafer probe 101 can be fabricated on a silicon wafer base to mimic the standard semiconductor work piece. It may also be manufactured on other materials such as ceramic, metal or glass to mimic other types of substrates used in plasma processing, and may have the same geometry as a standard substrate with substantively the same dimensions and weight. An example of one such configuration is shown in FIG. 2(a) which depicts an array of sensors (or sensor stacks) 201 distributed across the surface of a semiconductor wafer probe 101. In particular, FIG. 2(*a*) shows a plan view of a 300 mm wafer probe 101 with nine sensors 201. An alignment notch 202 is also shown. As will be explained in more detail hereinafter, these sensors 201 are preferably ion energy analysers for measurement of ion energy distribution at the substrate surface of the wafer probe 101.

FIG. 3(*a*) shows one possible architecture where each sensor 201 of the wafer probe 101 is modularised having its own dedicated power source, signal conditioning circuit, MCU, pressure sensor and wireless transponder.

In an alternative architecture, the electronic control circuit is centralised and the individual collector currents from each sensing element (Sensor 1 to Sensor n) are multiplexed to a centralised measurement circuit as shown in FIG. 3(*b*).

The ion energy analyser 201 is of particular interest for measuring the ion energy distribution at the substrate surface during plasma processing. Turning to FIG. 2(*b*), it can be seen that the ion energy analyser 201 comprises alternating layers of planar, parallel, conductive metal grids and insulators, the grids being electrically polarised in a systematic way to filter out plasma electrons, separate positive ions based on their energy, suppress secondary electron emission and collect ion current for measurement.

In FIG. 2(*b*), the plasma facing top surface 203 of the sensor 201 is flush with the substrate surface and made from the same material. An array of sampling apertures 204 are formed in this top surface 203, through which plasma species enter the device for analysis. The sampling apertures 204 can be sub millimetre in diameter and must provide sufficient open area to deliver adequate charged particle flux for detection. At the onset of plasma formation in the processing chamber a plasma sheath forms adjacent to the surface of the substrate and all other surfaces exposed to the plasma. The voltage applied to the sheath is used to manipulate the ion energy arriving at the substrate surface. The presence of the sensor apertures 204 have the potential to inhibit local sheath formation in the vicinity of said apertures. Any aperture exposed to the plasma should have dimensions that are smaller than the plasma Debye length ($\lambda_D$) to enable sheath formation above the aperture and thus prevent plasma penetration through the aperture. The $\lambda_D$ can be calculated using $$\lambda_D = \left( \frac{\varepsilon_0 k T_e}{n_e e^2} \right)^{0.5} \qquad (1)$$

Where $\varepsilon_0$ is the vacuum permittivity, $kT_s$ is the electron temperature, $n_s$ is the electron density and e is the electronic charge.

Using typical plasma processing conditions, with electron temperature of 3 eV and electron density of $10^{17}$ mm$^{-3}$, the Debye length is approximately 40 microns. Therefore, the apertures, typically being on a scale of millimetres, may not meet the sub-Debye length criterion in isolation.

In the embodiment illustrated in FIG. 2(*b*), a first conductive grid (or mesh), referred to as $G_0$ henceforth, is attached to the underside of the apertures 204 with good electrical connection between both surfaces. The grid $G_0$ is manufactured with sub-Debye length aperture size to guarantee plasma screening and has sufficient open area ratio to transmit sufficient ion flux for detection.

In another embodiment, $G_0$ can be attached to the plasma facing side of the apertures to achieve the same functionality as illustrated in FIG. 2(*c*).

In an alternative embodiment, the apertures 204 are manufactured directly in the plasma facing surface with sub-Debye length dimensions and in sufficient numbers to maintain adequate ion flux for detection, thus eliminating the need for an independent $G_0$. This embodiment is illustrated in FIG. 2(*d*).

In each configuration of 2(*a*), 2(*b*) and 2(*c*), $G_0$ adopts the same potential as the wafer probe outer body, determined by the excitation potential applied to the processing pedestal and the plasma properties. This potential acts as the reference potential for the sensor circuitry and the inter-grid electric field formation.

A first insulation layer 205 is disposed proximate to $G_0$, to provide electrical isolation from other grids e.g., $G_1$, $G_2$, and $G_3$. The insulation layer 205 can be made up of one or multiple insulators. Insulators may have an aperture array matching the ion sampling aperture array to allow ions pass through unimpeded. Insulators may alternatively have a single, large diameter aperture with open area spanning the entire aperture array.

In FIG. 2(*b*), a second grid, henceforth referred to as $G_1$, is disposed proximate to the first insulator 205 with identical or similar geometrical characteristics to $G_0$ in terms of aperture size and open area ratio. $G_1$ is coupled to a first voltage source and biased negatively with respect to $G_0$, thus creating the retarding electric field required to repel the incoming plasma electrons. A second insulation layer 206 with identical or similar dimensions to the first insulation layer is disposed proximate to $G_1$. A third grid, henceforth referred to as $G_2$, with identical or similar geometry to the other grids is disposed proximate to the second insulation layer. $G_2$ is coupled to a second voltage source and biased with a positive potential sweep relative to $G_0$ thus creating the electric field required for ion energy discrimination. A third insulation layer 207, with identical or similar dimensions to the other insulation layers, is disposed proximate to $G_2$. A fourth grid, henceforth referred to as $G_3$, with identical or similar geometrical characteristics to the other grids is disposed proximate to the third insulation layer 207. $G_3$ is coupled to a third voltage source and biased negatively with respect to the collector, thus creating the electric field required for suppressing secondary electron emission from the collector. A fourth insulation layer 208 with identical or similar dimensions to the other insulation layers is disposed proximate to $G_3$. An ion collection electrode, the collector, C, is disposed proximate to the fourth insulation layer 208. The collector is coupled to a fourth voltage source, through a current measurement circuit, and biased negatively with respect to $G_0$ to establish an attractive electric field to draw ions towards the collector for detection. A final insulation layer 209 is disposed between the collector electrode and the back plate of the sensor chassis. The grids are typically made from metals such as nickel or stainless steel but any other process compatible conductive material can be used. The insulators are typically made from ceramic, mica or other process compatible insulating material.

With reference to FIGS. 3(*a*) and 3(*b*) it can be seen that the signal conditioning provides a voltage source for each of grids $G_1$, $G_2$ and $G_3$ ($V_{G1}$, $V_{G2}$, $V_{G3}$) as well as the collector ($V_{GC}$) described above. The voltage, provided to $G_2$ ($V_{G2}$) is variable i.e., a voltage sweep is applied to $G_2$. Generation of a sufficiently high $G_2$ voltage sweep range to adequately measure the IED found in common plasma processes is important. Many of the plasma processes encountered generate ions with energies ranging from a few tens of eV to a few thousands of eV. This requires the $G_2$ voltage sweep range to extend from zero volts to a few thousand volts, relative to $G_0$, to adequately probe the IED in various industrial processes.

Figure 4A:
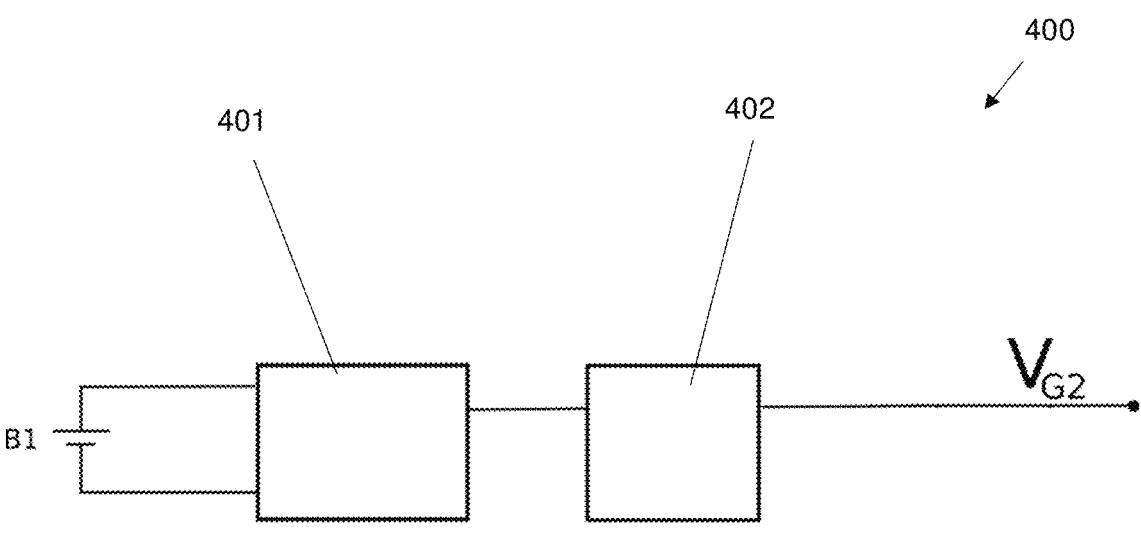
FIG. 4(a) shows a configuration for a high voltage generating circuit in accordance with the present teachings.

FIG. 4(a) shows the general configuration of a high voltage generating circuit 400, which can be used to generate the required high voltage sweep range. This circuit includes two stages which take the low voltage of a battery and generate the required high voltage sweep. Specific details of possible configurations of each stage are described hereinafter with respect to FIGS. 6 and 7. However, it will be appreciated that each stage is not limited to the details of FIGS. 6 and/or 7.

In FIG. 4(a), the circuit comprises a low voltage supply B1, a high voltage pulse generator 401 (first stage) and a voltage multiplier 402 (second stage). The voltage multiplier 402 is also known as a charge pump in the art. The high voltage pulse generator 401 provides a high voltage pulse train to the voltage multiplier 402. The voltage multiplier 402 uses the pulse train to charge a series of internal capacitors to charge the output to a voltage multiple times the pulse voltage from the pulse generator 401, typically 4 to 5 times.

Figure 3A:
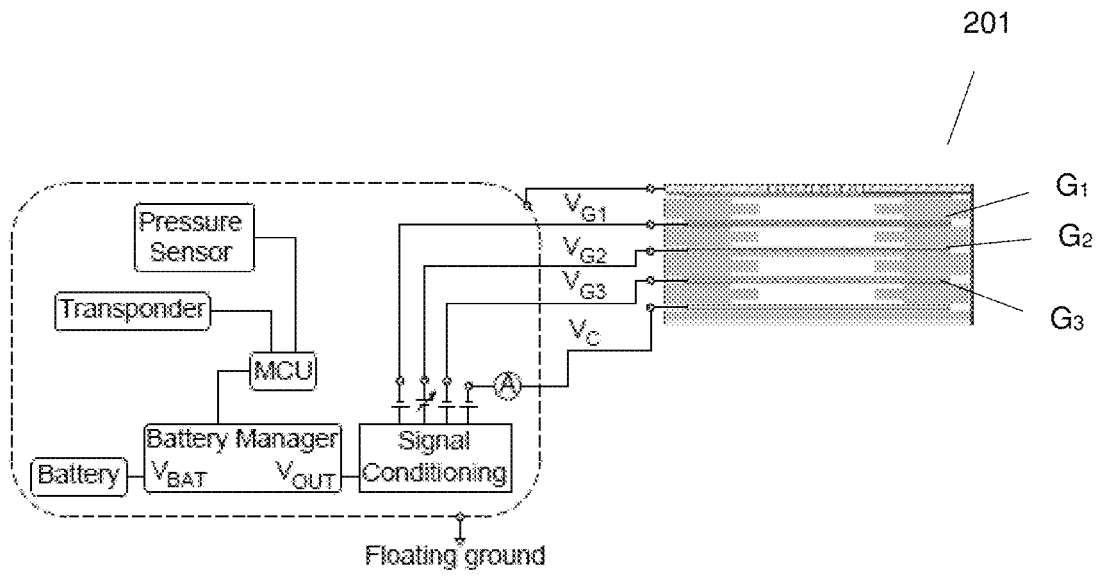
FIG. 3(a) shows one configuration for providing power to a sensor.
Figure 3B:
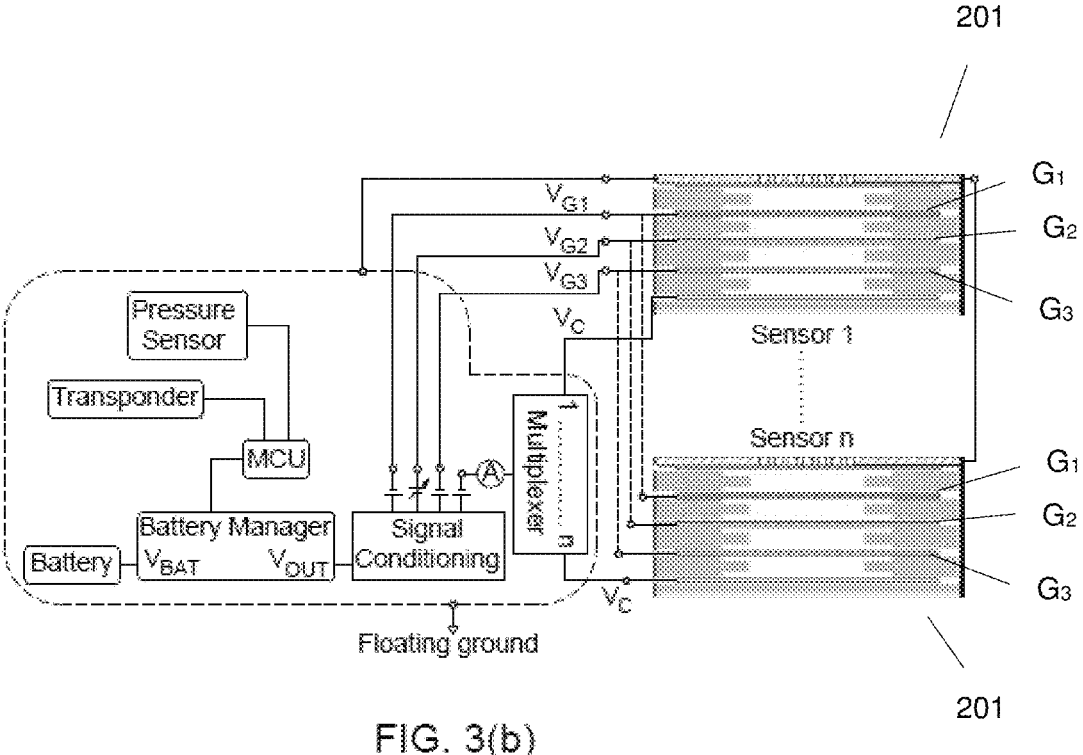
FIG. 3(b) shows another configuration for providing power to a sensor.

It will be appreciated the high voltage generating circuit 400 can be included in the signal conditioning circuitry outlined with respect to FIGS. 3(a) and 3(b). It will also be appreciated that the battery manager circuitry (explained in more detail below) shown in FIGS. 3(a) and 3(b) can be provided in circuit 400. The battery manager circuit regulates the battery output voltage ($V_{BAT}$) to a fixed voltage level ($V_{OUT}$). In an exemplary embodiment, the low voltage supply may be a single cell LiPo battery with a 3v DC regulator. It should be further appreciated that the arrangement of the high voltage generating circuit and the battery manager can be chosen as appropriate by the person skilled in the art.

The circuit of FIG. 4(a) generates the voltage sweep starting at zero and gradually increases to the maximum i.e., an increasing voltage sweep. Ion current is sampled as the sweep increases. However, it has been found that a rapid ramp up of the voltage and a slow release results in improved battery performance, That is, less power is taken from the battery for each sweep. Therefore, the sensor can be used for a longer period of time before the battery needs to be replaced or recharged.

Figure 4B:
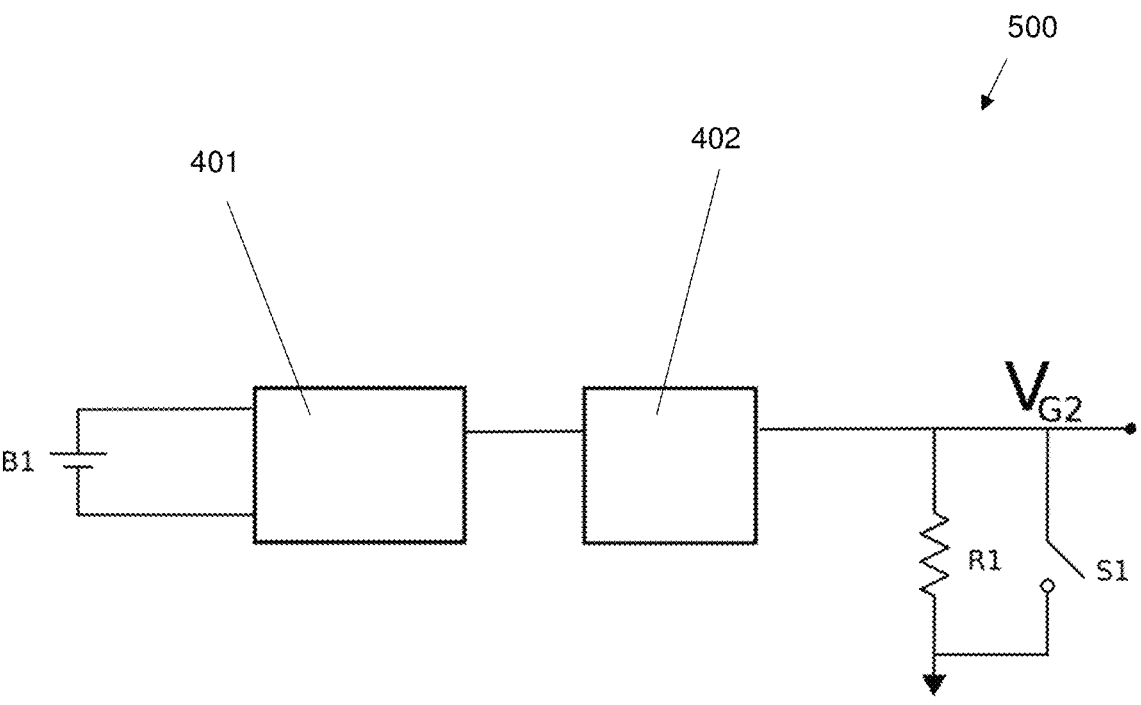
FIG. 4(b) shows another configuration for a high voltage generating circuit in accordance with the present teachings.

The high voltage generating circuit 500 of FIG. 4(b) is used to quickly ramp the voltage to the maximum level and then slowly sweep it back to zero. This circuit is very similar to the circuit of FIG. 4(a) but some further elements are required. A discharge resistor, R1, is added to control the discharge rate, i.e. timing, for the voltage sweep. A discharge switch, S1, is also added to discharge $V_{G2}$ prior to the voltage sweep being applied to $V_{G2}$. That is, the switch between the high voltage output to $G_2$ and the floating ground is used to discharge $G_2$ immediately before the voltage sweeping process is initiated. Ion current is sampled as the voltage decreases (voltage sweep descending).

In an exemplary embodiment, the circuit 500 allows $V_{G2}$ to be rapidly charged to just over 2 kV within 5 milliseconds and $V_{G2}$ is then allowed discharged slowly via R1 over a period of up to 1 second. As previously mentioned, the resistor R1 in FIG. 4(b) is used to set the discharge time for the high voltage. The discharge time could be on the order of seconds (or less) and the ion current is sampled at high speed as the voltage discharges. That is, the resistor is in parallel with the voltage multiplier 402 of the high voltage generating circuit. The resistance value of the resistor in parallel with the total capacitance to the floating ground of the voltage multiplier determines the rate at which the voltage discharges.

Figure 5:
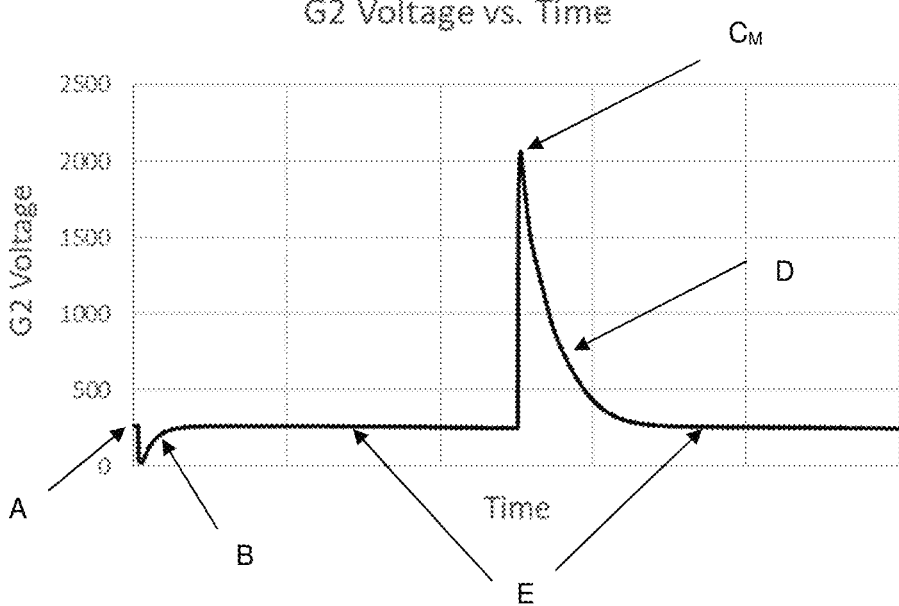
FIG. 5 shows a plot of the voltage applied to a conductive grid of the sensor in accordance with the present teachings.

Ion current collected on the frame of $G_2$ is returned to the plasma through resistor R1 to sensor chassis ground. The ion current reaching the frame of $G_2$ is a function of the plasma conditions and can span a wide range. As a result the $G_2$ voltage may not discharge fully to 0 V as one would like. Instead, it may plateau at some level, E, above 0 V as shown in FIG. 5. The plateau voltage E is determined by the ion current flowing through R1. The incoming ion current maintains the charge on the pump capacitors of the voltage multiplier 402. Thus the voltage cannot discharge further i.e., cannot discharge to 0 V. In this scenario, the low energy region of the ion energy distribution would become inaccessible. That is, the ion energy analyser would not be able to sample ion current for $G_2$ voltage below E.

To address this issue, the apparatus in accordance with the present teachings employs a two stage voltage scan in order to obtain measurements across the full ion energy distribution. The first stage involves taking ion current measurements while voltage applied to the third conductive grid, $G_2$, is ascending and the second stage involves taking ion current measurements while the voltage applied to the third conductive grid, $G_2$, is descending. The current measurements from both stages are then combined to get the complete set of measurements.

When the sensor in accordance with the present teachings is in standby mode (not sampling ion current) the plasma may be power on and ion current will flow from the third conductive grid, $G_2$, through resistor R1 to the sensor ground. This flow will charge the surface of $G_2$ to some voltage level shown at 'A' in FIG. 5. When it is desired for the sensor to take measurements, the S1 switch is closed to fully discharge the third conductive grid, $G_2$, to 0 V. The closing of the switch results in a near instantaneous discharge of the third grid as can be seen from FIG. 5. Next, switch S1 is returned to the open position and ion current begins to charge $G_2$ again as shown at 'B' in FIG. 5. The ion current is measured at high speed during this period, B, as the third gird $G_2$ is charged by the incoming ions. $G_2$ settles at plateau level 'E'. This is the first stage wherein ion current is measured for a $G_2$ voltage sweep between zero and the plateau voltage E determined by the ion current flowing through R1. That is, the ion current is measured while the $G_2$ voltage sweep is ascending/increasing. The resistance value of the resistor in parallel with the total capacitance to the floating ground of the voltage multiplier and the ion current determines the rate at which the first voltage charges.

In the second stage of operation the high voltage generating circuit is triggered and the $G_2$ voltage is quickly boosted/pumped to its maximum level '$C_M$'. Once the pumping is stopped, $G_2$ discharges through section 'D' back to level 'E' again, for the reason described earlier, and the ion current is measured during the discharge phase (descending voltage sweep). The resistance value of the resistor in parallel with the total capacitance to the floating ground of the voltage multiplier and the ion current determines the rate at which the second voltage discharges. The high and low energy regions of the ion energy distribution are then fully recovered when the two regions (charging and discharging) are stitched together for plotting.

It should be appreciated by the person skilled in the art that while the high voltage generating circuits described herein refer to supplying voltage to the third gird, $G_2$, of the sensor, the present teachings are not limited to this. The high voltage generating circuits described herein can supply voltage to any grid in the gird stack of the sensor. For example, the sensor may be provided with only two conductive grids and the voltage from the high voltage generating circuits applied to one of these. It will be appreciated the voltage sweep is applied to the grid used for ion energy discrimination and this grid can have any position in the stack of grids. The grid used for ion energy discrimination and to which the voltage sweep is applied can be considered to be a discriminator grid.

The low voltage dc source for the high voltage generating circuits may be a low profile solid state battery with dc voltage output in the range of 2.75 to 4.5V. To protect the battery from overcharging and over-discharging a battery manager is used. It is configured to disconnect the battery when the voltage depletes below a certain threshold. This in turn disconnects power to the main circuit. Power to the main circuit will not be restored until the battery voltage has recharged above the threshold level. The battery manager also draws the charge power from the RF antenna that forms part of the receiver in the docking station. The battery manager circuit also regulates the battery output voltage to a fixed voltage level which in the exemplary embodiments is 3.2 V.

More detailed configurations of each stage of the high voltage generating circuits 400, 500 of FIGS. 4(*a*) and 4(*b*) are described hereinafter with respect to FIGS. 6 and 7. The circuits of both FIGS. 6 and 7 can be configured to operate in accordance with the previously described two stage ion current measurement technique.

Figure 6:
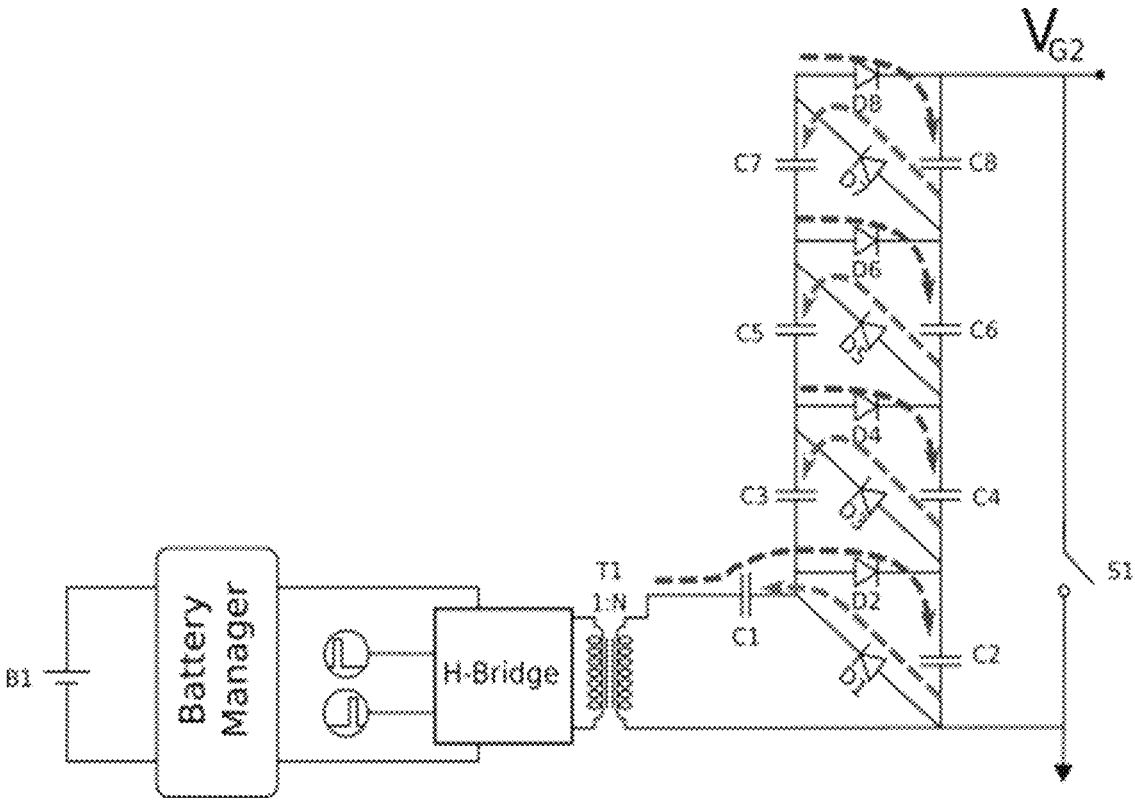
FIG. 6 shows a further configuration for a high voltage generating circuit in accordance with the present teachings.

FIG. 6 shows one configuration for the high voltage generating circuit, the microcontroller (MCU in FIGS. 3(*a*) and 3(*b*)), powered by the battery, is programmed to output a sinusoidal AC voltage which is swept across a range of frequencies. The output is coupled to the primary winding of a step-up transformer. The number of turns in the secondary winding is chosen to step up the voltage to the maximum level required for a particular frequency applied to the primary winding input. At the secondary winding output the voltage is rectified to generate a direct current (DC) voltage which may be coupled to a voltage multiplier (stage two) to further multiply the voltage to enhance the voltage range as required. The DC voltage generated at the output of the secondary winding is frequency dependent. By sweeping the frequency and/or amplitude of the AC signal applied to the primary winding, the DC voltage at the output of the secondary winding or multiplier is swept across the required voltage range from zero volts to a few thousand volts depending on the transformer turns ratio used. The current is sampled at regular voltage intervals in the high voltage sweep using an ADC to build up the current voltage characteristic. It should be appreciated that while a four stage voltage multiplier (quadrupler) is used in the exemplary embodiment, any number of stages can be chosen as appropriate by the person skilled in the art.

The high voltage generating circuit shown in FIG. 6 is herein described in more detail. As mentioned, this circuit includes a low voltage to high voltage transformer (T1) (first stage) feeding a voltage multiplier (second stage). The voltage multiplier is a type of Cockcroft-Walton voltage multiplier circuit consisting of capacitor components C1, C2, C3 and C4 in combination with diode components D1, D2, D3 and D4. A Low voltage AC signal is generated on the primary side of T1 using a H-bridge switch. The H-bridge, or any similar switching topology, is used to allow bipolar current flow through the primary winding of T1 from the single rail power supply. The AC signal frequency and amplitude is controlled by the microcontroller. The 1:N turns ratio transformer T1 produces a high voltage AC signal on secondary side. During the positive half-cycle, C2 is charged via C1 and D2 and C4 is charged via C1, C3 and D4. During the negative half-cycle C1 is charged via D1 and C3 is charged via C2 and D3. After a pre-determined number of AC cycles, the voltage across all capacitors equalise, and $VG_2$ reaches the maximum level of four times the voltage across C2. It is evident that $VG_2$ can be gradually increased from zero to the maximum by controlling the frequency and amplitude of the AC signal applied to the primary winding of T1. Thus, the typical increasing voltage ramp (saw-tooth or staircase function) used to drive the ion energy discrimination in retarding field analysers can be achieved. Once the maximum voltage in the voltage sweep has been reached, and the resultant ion current has been measured, the AC voltage applied to the primary winding of T1 is turned off in order to reset $VG_2$ to zero in preparation for the next voltage sweep. The switch S1 is also closed at this point to help discharge $G_2$ and the capacitors quickly.

In another configuration of the circuit for generating the voltage sweep the principles of boost conversion and/or charge pumping can be applied. A hybrid solution is provided but it should be clear that variations of the current technique can be applied. FIG. 7 illustrates the circuit used to generate the high voltage sweep using this technique. The battery delivers a 3V output to the input of a low profile DC-DC converter to increase the voltage to approximately 80V. The 80V signal is coupled through a series boost inductor and diode (boost circuit) to a voltage multiplier circuit. A field-effect transistor (FET) controlled by a pulse width modulated (PWM) signal is coupled to the system floating ground after the series diode to modulate the 80 V supply and drive the voltage multiplier circuit. At the input to the voltage multiplier circuit the voltage has been boosted to approximately 250V by the boost circuit, but may be higher as required by the application. In this example the voltage multiplier has four stages but can have many more stages to deliver higher and higher voltages. Each voltage multiplier stage has the typical design where each stage increases the voltage applied to the input. The first capacitor C1 will charge to a maximum level of 500V after a sufficient number of cycles of the PWM signal has taken place. Similarly the output of C3 will reach 1000 V, C5 will reach 1500V and C7 will reach 2000V. At each stage a series of diodes are configured to prevent the charge storage capacitors from discharging during the PWM off state thus providing the "multiplying" effect desired to generate the high voltage sweep. The ion current is sampled at regular voltage intervals in the high voltage sweep using the ADC to build up the current voltage characteristic.

Figure 7:
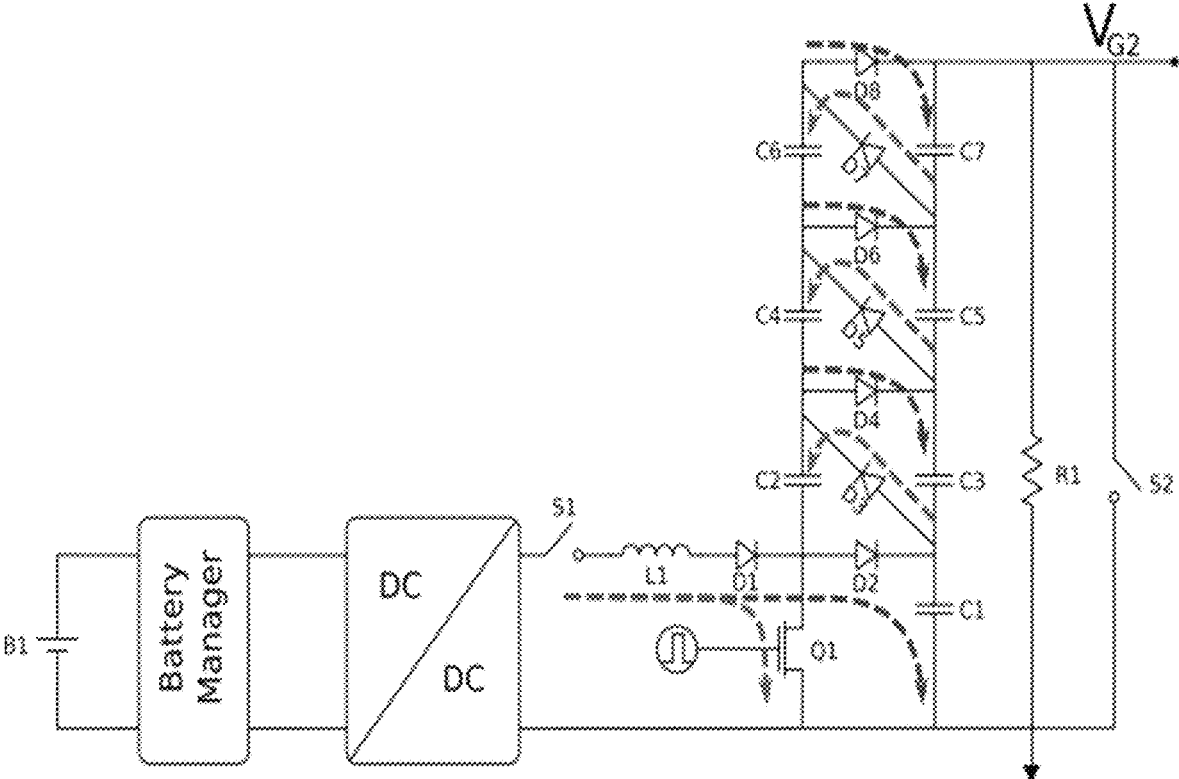
FIG. 7 shows another configuration for a high voltage generating circuit in accordance with the present teachings.

The configuration of FIG. 7 was devised to meet more stringent height requirements. The battery and battery manager components are the same as in FIG. 6. The battery manager feeds an off the shelf, low profile, DC-DC converter with integrated voltage doubler to step up the DC voltage level to 80 V. The high voltage generating circuit comprises of a boost section followed by a voltage multiplier section. The boost section is a typical DC-DC boost converter topology using an inductor L1, MOSFET transistor Q1 (switched on and off with a pulse width modulator), diode D2 and capacitor C1. This allows the circuit to charge capacitor C1 to voltages greater than 80V, the DC-DC output voltage in the exemplary embodiment therein. The multiplier section is very similar to the Cockcroft-Walton type voltage multiplier circuit of FIG. 6 with capacitor components C2, C3, C4, C5, C6, and C7 and diode components D3, D4, D5, D6, D7 and D8. The circuit of FIG. 7 generates the voltage sweep in a different way compared to the circuit of FIG. 6. Instead of a voltage sweep which starts at zero and gradually increases to the maximum, this circuit is used to quickly ramp the voltage to the maximum level and then slowly sweep it back to zero. However, it could also be used to sweep the voltage gradually from zero to maximum voltage.

The skilled person should appreciate that the present teachings are not limited to a MOSFET transistor. Rather any suitable transistor may be chosen e.g., bipolar transistor.

It should be noted that the circuit of FIG. 6 can be operated in the discontinuous mode described for FIG. 7, where the voltage can also be rapidly increased to the maximum before slowly discharging back to zero i.e., the circuit of FIG. 6 can provide a descending voltage sweep. As is evident to the person skilled in the art, this would require the addition of a discharge resistor, R1, as described in more detail with respect to FIGS. 4(*b*) and 7.

Because the circuit illustrate in FIG. 7 operates discontinuously, D1 is added to prevent current flowing back to floating ground via L1, from C2, after the energy stored in L1 has depleted.

A switch S1 is used to connect the boost circuit to the 80V output of the DC-DC converter. S1 remains closed while the VG$_2$ is charging to the maximum level. The switching rate of the MOSFET transistor Q1 is controlled microprocessor output. When Q1 is open, C1 is charged from the DC-DC converter 80 V output and the energised inductor, via D1 and D2. Then C3 is charged by C2 via D4, C5 is charged by C4 via D6 and C7 is charged by C6 via D8. When Q1 is closed, L1 is energised by current flowing from the DC-DC converter to floating ground via Q1. The voltages across capacitors C2, C4 and C6 relative to floating ground decrease due to Q1 being closed and drop below the voltages across capacitors C1, C3 and C5 respectively. Now, C2 is charged by C1 via D3, C4 is charged by C3 via D5 and C6 is charged by C5 via D7. With the boost segment operating in discontinuous mode, the energy (E) stored in L1 is given by $$E = \frac{(V \times T_{ON})^2}{2 \times L},$$

V is the voltage across L1, T$_{ON}$ is the length of time the transistor switch is closed and L is the inductance of L1. After a number of Q1 switch cycles, the voltages across all capacitors equalise to give the maximum VG$_2$ required. In this example VG$_2$ will be approximately four times the voltage across C1. More stages can be added to increase VG$_2$ as required. Once the maximum VG$_2$ has been reached, switch S2 is closed to initiate the discharge of VG$_2$ and slowly decrease it to zero volts. Resistor R1 is placed in parallel with S2. The combination of R1 and the capacitors set the VG$_2$ discharge sweep rate.

The voltage multiplier (stage 2 of the high voltage generating circuit) of FIG. 7 has 2 parallel strings of capacitors, (C1, C3, C5 and C7) and (C2, C4 and C6). When the transistor switch Q1 is open, the input to the multiplier is high, and it charges C1, C2 charges C3, C4 charges C5, and C6 charges C7. When Q1 is closed, input is low and C1 charges C2, C3 charges C4, and C5 charges C6. The switch Q1 is toggled on and off repeatedly so that all capacitors have a charge voltage equivalent to the input voltage. As a result, the output VG$_2$ is 4 times the input voltage. Using the voltage multiplier directly from the 80V line would give a maximum voltage of about 300V, when efficiency is taken into account.

To increase that voltage further, the voltage multiplier is preceded by a boost circuit. Energy is stored in an inductor L1 and transferred to a capacitor C1, where diode D1 prevents the energy going back to the input via the inductor. The input to the boost circuit is 80V, when the transistor is on, the inductor is short to ground, increasing the inductor current and storing energy. When the transistor is off, current will continue to flow through the inductor to capacitor C7 via D8 and D1. The voltage across capacitor C7 will increase as its stored energy increases. The input voltage is 80V, the MOSFET transistor shorts both the inductor and voltage multiplier input to ground. The transistor is released after a few microseconds, which induces the current needed to achieve the charge pumping effect to generate the maximum voltage VG$_2$.

It will be appreciated by the person skilled in the art that the voltage values provided with respect to the exemplary embodiments of FIGS. 4(*a*), 4(*b*), and 5-7 are merely exemplary. The present teachings should not be considered to be restricted to these values. Rather, these circuits can be configured as appropriate to provide the desired voltages.

The invention is not limited to the embodiment(s) described herein but can be amended or modified without departing from the scope of the present invention.

The invention claimed is:

1. A method of operating an apparatus to obtain ion energy distribution measurements in a plasma processing system comprising:

providing a substrate for exposure to the plasma in the plasma processing system, the substrate having an ion energy analyser disposed therein for measuring the ion energy distribution at the substrate surface during plasma processing, the ion energy analyser comprising a plurality of conductive grids, and a collection electrode, each conductive grid separated by an insulating layer;

providing a high voltage generating circuit and a battery, both integrated within the substrate, the high voltage generating circuit configured to take the output voltage of the battery to power the high voltage generating circuit and apply a voltage to a first grid of the plurality of conductive grids;

providing a high voltage switch configured to discharge the first grid to a floating ground of the apparatus and a resistor in parallel with the high voltage switch;

sampling ion current during a first stage while a first voltage is being charged on the first grid from the floating ground potential to a plateau voltage; and sampling ion current during a second stage while a second voltage applied to the first grid is discharging through the resistor from a predetermined voltage generated by the high voltage generating circuit to the plateau voltage.

2. The method of claim 1 further comprising closing the high voltage switch to discharge the first grid to the floating ground prior to sampling ion current during the first stage.

3. The method of claim 1 further comprising opening the high voltage switch to allow ion current from a plasma process to charge the first grid to the plateau voltage.

4. The method of claim 1 wherein the plateau voltage is determined by the ion current from the plasma process flowing through the resistor.

5. The method of claim 1 wherein the first voltage is an ascending voltage sweep and the second voltage is a descending voltage sweep.

6. The method of claim 1 wherein the high voltage circuit comprises a voltage multiplier and the resistor is in parallel with the voltage multiplier.

7. The method of claim 6 wherein the resistance value of the resistor in parallel with the total capacitance to the floating ground of the voltage multiplier and the ion current determines the rate at which the second voltage discharges.

8. The method of claim 6 wherein the resistance value of the resistor in parallel with the total capacitance to the floating ground of the voltage multiplier and the ion current determines the rate at which the first voltage charges.

9. The method of claim 1 further comprising combining current measurements taken during the first and second stages to obtain a complete set of measurements.

10. The method of claim 9 further comprising plotting the complete set measurements to provide an ion energy distribution.

11. The method of claim 1 wherein the plurality of conductive grids are arranged as a stack of grids and the first grid is any one of the grids in the stack, the first grid being used for ion energy discrimination.

12. The method of claim 1 where the battery is a single cell LiPo battery.

13. The method of claim 1 where the battery is a low profile solid state battery with a DC voltage output in the range of 2.75 to 4.5V.

* * * * *